US006541996B1

(12) United States Patent
Rosefield et al.

(10) Patent No.: US 6,541,996 B1
(45) Date of Patent: Apr. 1, 2003

(54) DYNAMIC IMPEDANCE COMPENSATION CIRCUIT AND METHOD

(75) Inventors: Peter L. Rosefield, Stouffville (CA); Oleg Drapkin, Toronto (CA); Grigori Temkine, Toronto (CA); Gordon F. Caruk, Bramalea (CA); Roche Thambimuthu, East York (CA); Kuldip Sahdra, Richmond Hill (CA); Aris Balatsos, Toronto (CA)

(73) Assignee: ATI International SRL, Christchurch (BA)

( * ) Notice: Subject to any disclaimer, the term of this patent is extended or adjusted under 35 U.S.C. 154(b) by 0 days.

(21) Appl. No.: 09/469,084

(22) Filed: Dec. 21, 1999

(51) Int. Cl.$^7$ .............................................. H03K 19/23
(52) U.S. Cl. ............................ 326/30; 326/86; 326/27; 326/26; 327/108; 327/389; 327/391
(58) Field of Search ........................... 326/27, 87, 30; 327/363, 382; 365/189.05

(56) References Cited

U.S. PATENT DOCUMENTS

| | | | | |
|---|---|---|---|---|
| 4,719,369 A | * | 1/1988 | Asano et al. ................. | 326/30 |
| 5,134,311 A | * | 7/1992 | Biber et al. .................. | 327/108 |
| 5,296,756 A | | 3/1994 | Patel et al. | |
| 5,457,407 A | | 10/1995 | Shu et al. | |
| 5,485,115 A | * | 1/1996 | Nordeng ..................... | 327/363 |
| 5,486,791 A | * | 1/1996 | Spitalny et al. ............. | 330/282 |
| 5,493,246 A | * | 2/1996 | Anderson .................... | 327/382 |
| 5,528,166 A | * | 6/1996 | Iikbahar ...................... | 326/27 |
| 5,666,078 A | * | 9/1997 | Lamphier et al. ........... | 327/108 |
| 5,898,321 A | * | 4/1999 | Iikbahar et al. ............. | 326/87 |
| 5,955,894 A | * | 9/1999 | Vishwanthaiah et al. ..... | 326/86 |
| 6,021,071 A | * | 2/2000 | Otsuka ........................ | 365/189.05 |
| 6,114,885 A | * | 9/2000 | Yang et al. .................. | 326/27 |
| 6,141,258 A | * | 10/2000 | Kawasumi .................. | 365/189.05 |

FOREIGN PATENT DOCUMENTS

EP  0 978 943 A  2/2000

OTHER PUBLICATIONS

Gabara, T.K. et al. "Digitally Adjustable Resistors in CMOS for High–Performance Applications," IEEE Journal of Slid–State Circuits, US, IEEE Inc., New York, vol. 27, No. 8, Aug. 1, 1992.
Copy of European Search Report for European Patent APplication EP 00 31 1249.
Annex to European Search Report on European Patent Application No. EP 00 31 1249.
Gerald L. Esch, Jr. and Robert B. Manley, "Theory and Design of CMOS HSTL I/O Pads," The Hewlett–Packard Journal, Aug. 1998.
A.G.P. Design Guide Rev. 1.0, Intel, 1998, pp. 19–20.

* cited by examiner

Primary Examiner—Michael Tokar
Assistant Examiner—Vibol Tan
(74) Attorney, Agent, or Firm—Vedder, Price, Kaufman and Kammolz

(57) ABSTRACT

An impedance compensation circuit and method for an input/output buffer provides dynamic impedance compensation by using programmable impedance arrays and a dynamically adjustable on-chip load. Accordingly, among other advantages, only a single off-chip or external calibrated impedance resistor is used and only a single test pad is necessary.

47 Claims, 6 Drawing Sheets

DYNAMIC IMPEDANCE COMPENSATION CIRCUIT AND METHOD

FIELD OF THE INVENTION

The invention relates generally to impedance matching networks and more particularly to programmable on-chip impedance matching networks.

Background Of The Invention Input/output buffers are used in many integrated circuit applications. Conventional I/O buffers include, for example, push/pull buffer configurations that include, for example, an output driver pull up circuit and an output driver pull down circuit. I/O buffers are often connected to external or off chip pads on printed circuit boards or other integrated circuits. The I/O buffers are connected to other circuits through transmission lines, such as printed circuit boards traces or any other suitable transmission line. As is known in the art, transmission line signal distortions can result from impedance mismatches between the output buffer circuitry, and the transmission line impedance. These signal distortions can vary due to fabrication process variations, temperature variations, and other variations. Accordingly, I/O buffers have been designed to match the output impedance of the buffer with the transmission line impedance. Without proper impedance matching, overshooting, undershooting, and signal distortion can occur, particularly at high speeds.

Conventional solutions typically incorporate the use of off-chip components to implement matching termination networks. However, these can take up large amounts of board space. Other on-chip solutions require the use of separate test I/O pads for determining suitable impedance matching. For example, one external test pad is typically used to determine the suitable pull up circuit impedance whereas a separate additional test pad is used to determine suitable impedance matching for the pull down circuit of the output buffer. In addition, separate external impedance calibration resistors are used for each I/O buffer section. The use of additional test pads and additional external resistors can impact board density, reliability and cost.

Once solution, for example, as disclosed in an article entitled "Design of CMOS HSTL I/O Pads", August 1998, by Gerald L. Esch, Jr., et al., describes an on-chip impedance matching network that provides a type of controlled impedance I/O pad by controlling a serially connected resistive element separate from the output dirvers. For example, an array of programmable resistors in the form of parallel coupled transistors, are controlled by on-chip calibration circuitry to program an on-chip impedance array by turning on and off various combinations of NFET transistors, using an up down counter. An external calibration resistor is connected to an internal chip pad. A differential amplifier is used to compare the internal pad voltage to a reference voltage. A difference between input voltages of the differential amplifier is perceived as a resistance mismatch between the external calibration resistor and the resistance of the transmission line. The differential amplifier's output is programmed as an up down counter to increment or decrement an output. The calibration is typically continuous. The article also discloses using a separate programmable resistor array for each of a pull down section and a pull up section of an output buffer. However, this can unnecessarily increase the complexity and cost of the impedance matching circuit.

In addition, solutions that employ a plurality of external calibration resistors typically duplicate the output buffer structure as the impedance compensation structure. Where two test pads and two external calibration resistors are used, the pull up circuit, such as a P channel based pull up circuit, and an N channel output buffer pull down circuit, are typically independently tested and matched during normal operation of the chip. However, using dual calibration resistors can generate unnecessary internal noise. Known programmable impedance matching circuits effectively duplicate the structure of an actual I/O buffer and the actual I/O buffer includes corresponding programmable resistor arrays that are then programmed to be identical to the impedance level determined through the I/O buffer impedance matching circuit. Typically, such I/O buffer impedance compensation circuits use, for example, an external pull up calibration resistor that has a value believed equal to be the line impedance to determine an appropriate impedance setting for the I/O pull down circuit. Similarly, an external pull down calibration resistor is coupled to ground, and is used to determine a suitable impedance level for the pull up circuit.

Accordingly, there exists a need for an impedance compensation method and circuit for an input/output buffer having an output driver pull up circuit and an output driver pull down circuit.

BRIEF DESCRIPTION OF THE DRAWINGS

The invention will be more readily understood with reference to the following drawings wherein.

DETAILED DESCRIPTION OF A PREFERRED EMBODIMENT OF THE INVENTION

Briefly, an impedance compensation circuit and method for an input/output buffer provides dynamic impedance compensation by using programmable impedance arrays and a dynamically adjustable on-chip load. Accordingly, among other advantages, only a single off-chip calibration resistor is used, and only a single test pad is necessary.

In one embodiment, the impedance compensation circuit includes an on-chip programmable pull up impedance matching array, such as a plurality of parallel coupled PMOS transistor fingers, an on-chip programmable pull down impedance matching array, such as a plurality of NMOS parallel coupled transistor fingers, and a configurable on-chip impedance element, such as a plurality of parallel coupled PMOS transistors. The configurable on-chip impedance measurement array is operatively coupled to both the on-chip programmable pull up impedance matching array, and to the on-chip programmable pull down impedance matching array.

In one embodiment, a controller controls calibration of either one of the on-chip programmable pull up impedance matching array, or the on-chip programmable pull down impedance matching array, to an impedance that matches a predetermined off-chip calibration impedance, such as that dictated by an external calibration resistor. The impedance compensation method includes using the impedance setting of the configurable on-chip impedance element for one I/O buffer section, as an internal load for providing an on-chip impedance reference value to determine a suitable impedance matching level for the other section of the I/O buffer.

Figure 1:
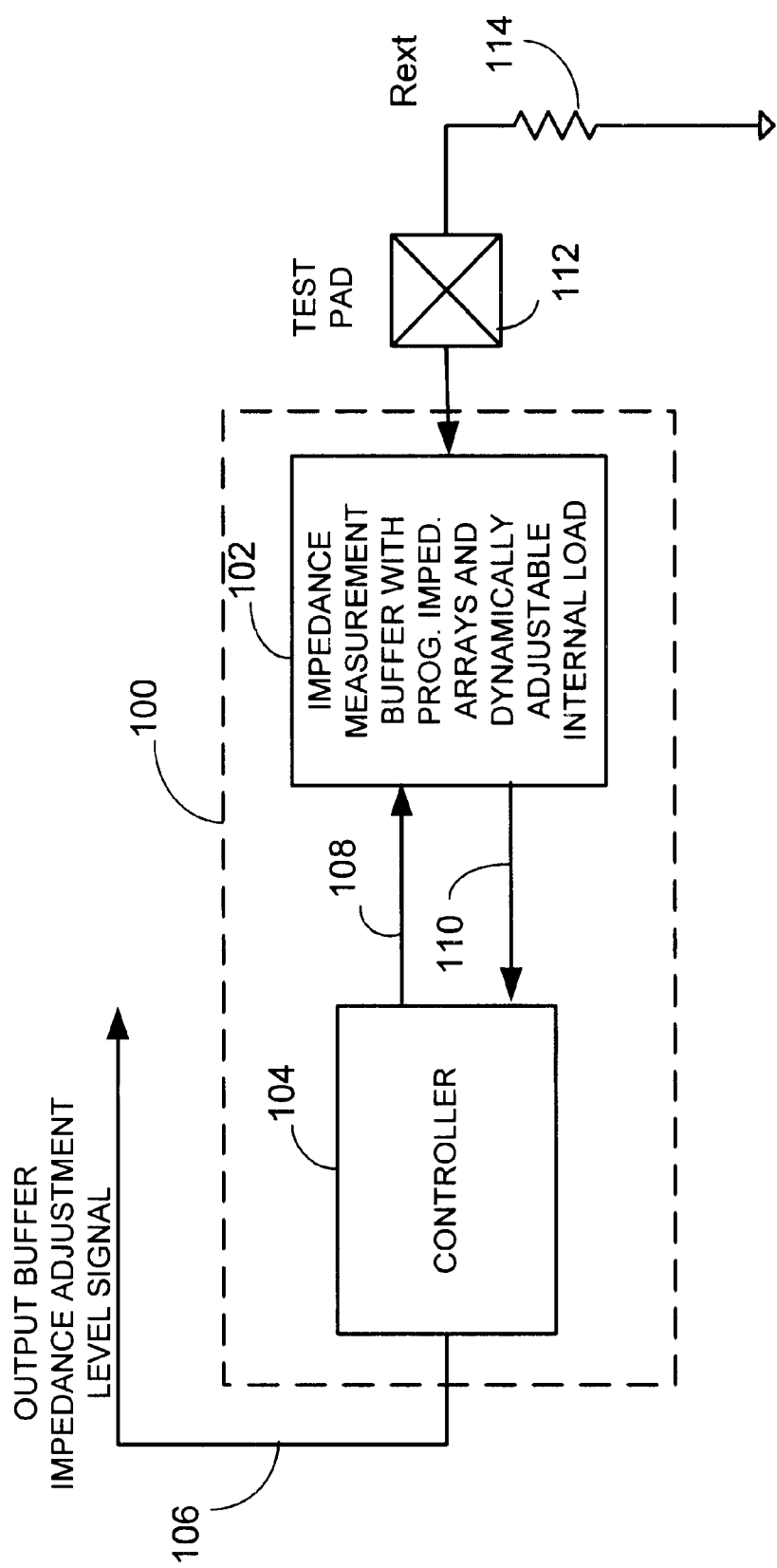
FIG. 1 is a block diagram illustrating an example of an impedance compensation circuit in accordance with one embodiment of the invention.

FIG. 1 illustrates one example of an impedance compensation circuit 100 that includes an impedance measurement buffer 102 that includes programmable impedance matching arrays, and also includes a dynamically adjustable internal load. The impedance compensation circuit 100 also includes a controller 104 that generates an output buffer impedance control signal 106 to an I/O buffer to set an impedance level for the output driver pull up circuit and the output driver pull down circuit. The controller 104 also generates control signals 108 to and receives input signals 110 from the impedance measurement buffer 102 to suitably calibrate programmable impedance arrays and to suitably adjust the dynamically adjustable internal load. The controller 104 may be a state machine or any other suitable hardware, software or combination thereof. The impedance compensation circuit 100 is operatively coupled to an off-chip test pad 112 which is coupled to an external calibration resistor 114, or any other suitable impedance element, such as a high precision resistor set to a value that may be coincident with an expected line impedance of a transmission line that is connected to the output buffer (not shown). It will be recognized that the test pad 112 may be included on a chip containing the impedance compensation circuit, if desired and that the calibration resistor may also reside on a same chip containing the impedance compensation circuit 100.

Figure 2:
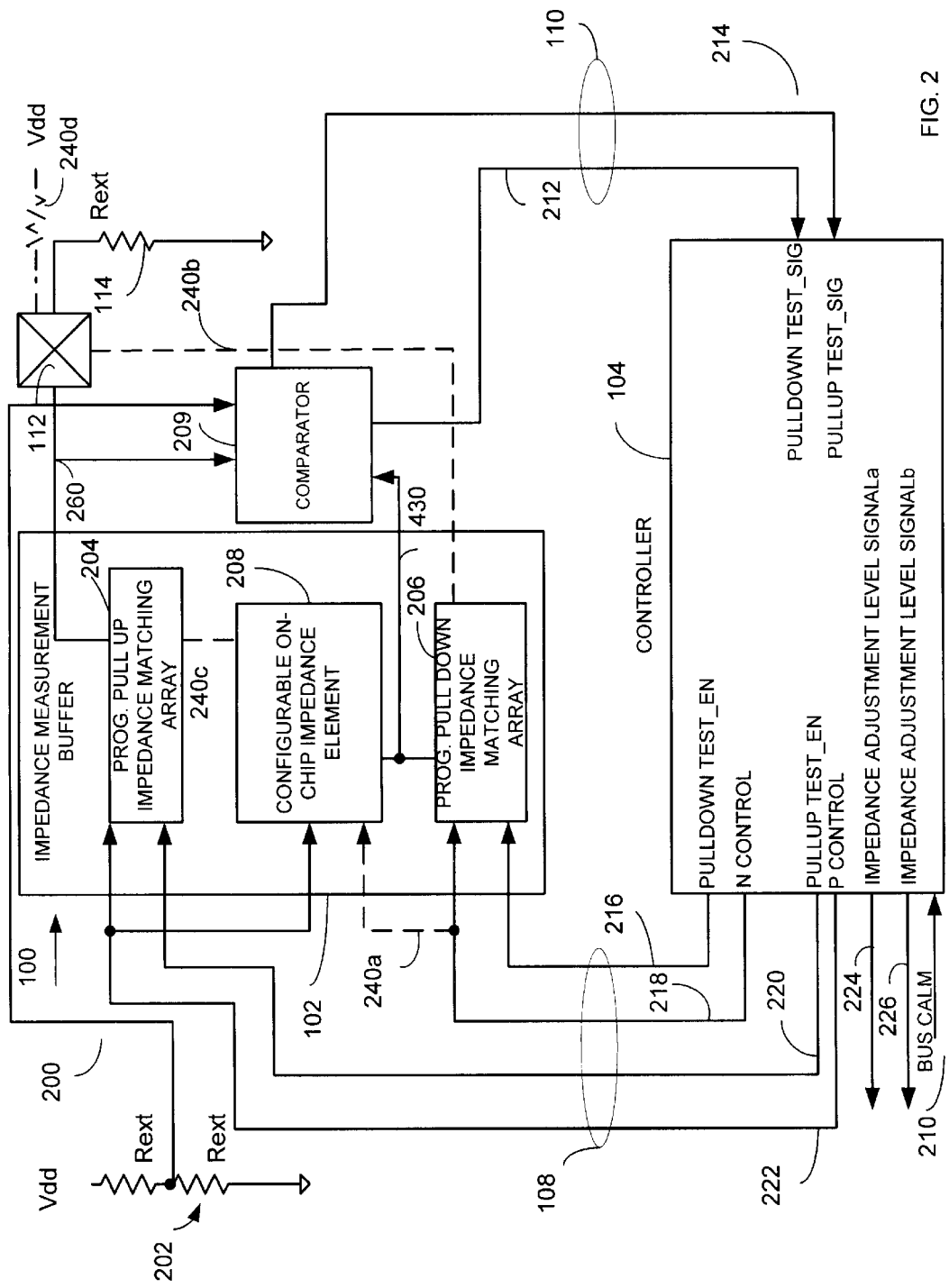
FIG. 2 is a block diagram illustrating in more detail, one example of an impedance compensation circuit in accordance with one embodiment of the invention.

FIG. 2 illustrates in more detail one example of an impedance compensation circuit 100 that operatively receives a reference voltage 200 from an internal or external reference voltage source 202. In this embodiment, the impedance measurement buffer 102 includes an on-chip programmable pull up impedance matching array 204, an on-chip programmable pull down impedance matching array 206 and a configurable on-chip impedance element 208 that serves as the adjustable internal load. The configurable on-chip impedance element 208 is operatively coupled to both the on-chip programmable pull up impedance matching array 204 and to the on-chip programmable pull down impedance matching array 206. The impedance compensation circuit 100 also includes a comparator 209, such as one or more differential comparator(s) or any other suitable logic or software based comparator arrangement.

The controller 104 is operatively coupled to the on-chip programmable pull up impedance matching array 204, the on-chip programmable pull down impedance matching array 206, and to the configurable on-chip impedance element 208. The controller 104 receives a bus calm indication 210 indicating when to sample a pull up test signal 214 or a pull down test signal 212 output from the comparator 209. The pull up test signal 214 and the pull down test signal 212 represent a change in impedance, and hence a voltage drop, across the on-chip programmable pull up impedance matching array 204 and across the on-chip programmable pull down impedance matching array 206, respectively. The controller 104 samples the pull up test signal 214 or the pull down test signal 212 in response to detecting that an I/O buffer bus is idle. This is determined, for example, by evaluating the bus calm signal 210, which indicates when the I/O buffer bus, such as an AGP bus, is idle. This may come from any suitable bus detection logic. The controller 104 generates a pull down test enable signal 216 (if desired), a programmable pull down impedance matching array control signal 218, a pull up test enable signal 220 (if desired), a pull up impedance matching array control signal 222, an output buffer pull up impedance adjustment level signal 224, and an output buffer pull down impedance adjustment level signal 226. The impedance adjustment level signals control corresponding programmable impedance arrays associated with the actual I/O buffer.

The programmable pull up impedance matching array 204 outputs a pull up test signal 214 and the programmable pull down impedance matching array generates the pull down test signal 212.

The pull up impedance control signal 222 represents, for example, a control signal (P CONTROL) to control an impedance level of the on-chip pull up impedance matching array. Similarly, the pull down impedance matching control signal 218 serves to control an impedance level for the programmable pull down matching array 206. The impedance adjustment level signal 224 represents, for example, a first impedance adjustment level for an output driver pull up circuit. The impedance adjustment level signal 224 is based on a voltage drop across the external impedance element 114 using the on-chip programmable pull up impedance matching array 204. Similarly, the impedance adjustment level signal 226 serves as an impedance adjustment level for the output driver pull down circuit, which is based from a current impedance setting of the configurable internal impedance element 208 that was set while determining the first impedance adjustment level signal 224. The impedance adjustment level signal 226 hence is determined using the on-chip programmable pull down impedance matching array in connection with the current impedance setting of the configurable on-chip impedance element 208 as originally set by the on-chip programmable pull up impedance matching array when determining the impedance adjustment level signal 224.

Figure 5:
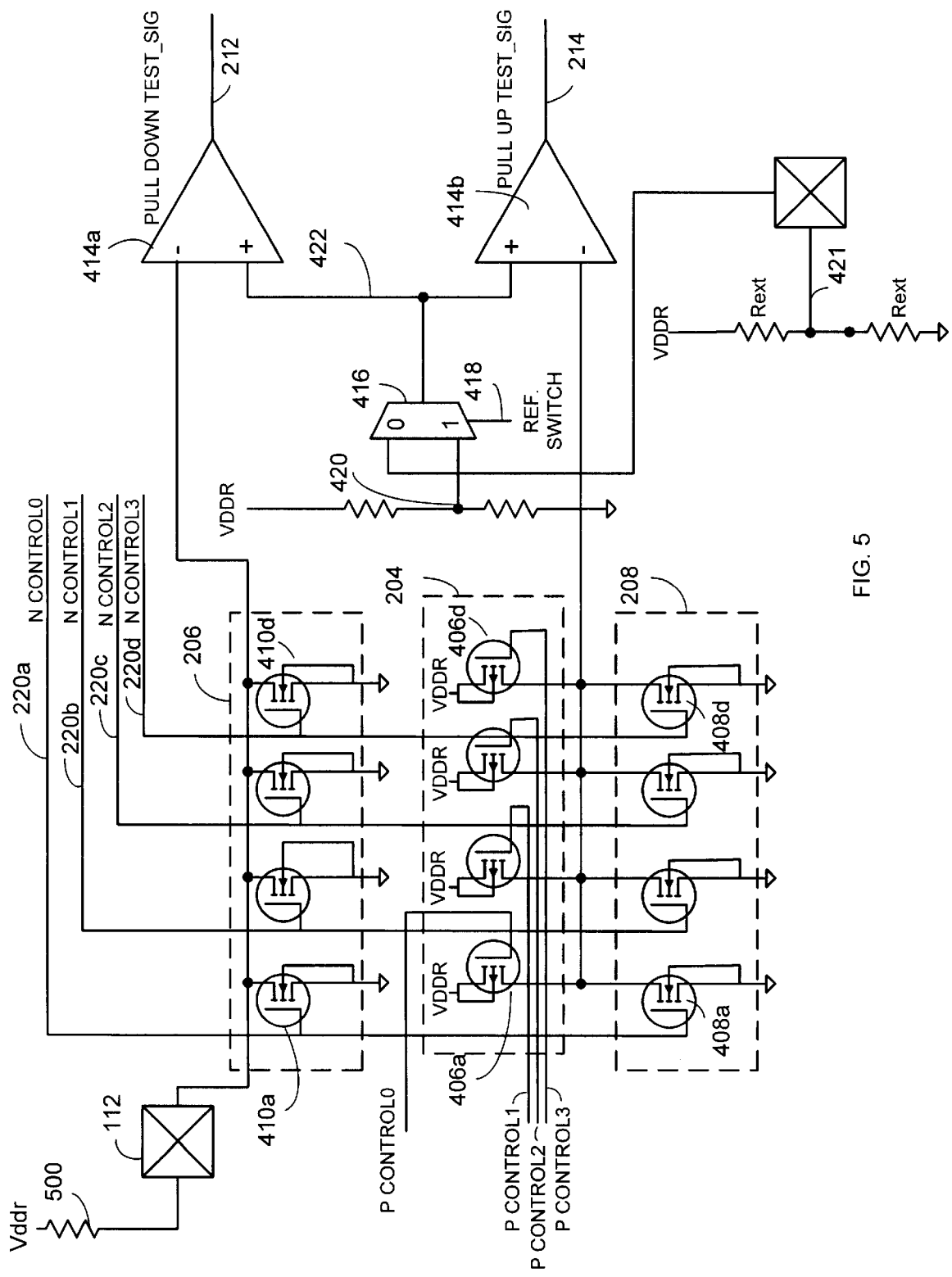
FIG. 5 is an alternative embodiment of an impedance compensation circuit in accordance with one embodiment of the invention.

The dashed lines generally indicated as 240a, 240b, 240c and 240d represent, for example, changes in the configuration of FIG. 2 to accommodate an impedance matching compensation where the external resistor 114 is a pull up resistor instead of a pull down resistor (See, e.g., FIG. 5). Accordingly, it will be recognized by one of ordinary skill in the art, that although the description of the invention will be with reference to an external pull down resistor 114, the invention is also applicable where a single external impedance reference resistor is taken to be a pull up resistor. It will be recognized also that the same matching procedure could be done if the external impedance value is bigger or smaller than the transmission line impedance value. In this case N control and P control signals can be scaled by controller to provide the output buffer impedance matching the transmission line impedance.

The control signals 218 and 222 serve as pull up and pull down impedance settings to adjust, for example, a pull up impedance setting or a pull down impedance setting. In this embodiment, the configurable on-chip impedance element 204 serves as a pull up impedance that is also used to match a pull down impedance for the pull down impedance matching array 206. Stated another way, the configurable on-chip impedance element 208 serves as an on-chip adjustable load during the pull down impedance matching array configuration process so that an external pull up resistor need not be used, nor does an additional test pad need to be used. The configurable on-chip impedance element 208 is configured during the configuration of the on-chip programmable pull up impedance matching array 204 to serve as a calibrated pull up resistance. Accordingly, when the external impedance element 114 is matched to be equal to the on-chip programmable pull up impedance matching array 204, the impedance value for the configurable on-chip impedance element 208 of the array is duplicated. Subsequently, the controller then determines the impedance adjustment level 226 for the current impedance setting of the configurable internal impedance element 208. The configurable on-chip impedance element 208 is adjusted using the control signal 222 used to adjust the on-chip programmable pull up impedance matching array. The configurable on-chip impedance element 208 is adjusted to an impedance setting based on the determined first impedance adjustment level 224.

In operation, the controller 104 determines the impedance adjustment level 224 by comparing a voltage drop across the external impedance element 114 by comparing, for example, the input voltage level 260 with a voltage drop across the on-chip programmable pull up impedance matching array 204. The controller programs the on-chip programmable pull up impedance matching array 204 in response to the comparison of the voltage drops by evaluating the pull up test signal 214 to determine whether the pull up test signal 260 is above or below a predetermined threshold.

The controller 104 controls either one of the on-chip pull up impedance matching array 204 or the on-chip programmable pull down impedance matching array 206 to provide an impedance setting to match a predetermined off-chip impedance level, such as the pull down external resistor 114 or a pull up resistor indicated as dotted line 240d. An impedance compensation method uses the impedance setting of the configurable on-chip impedance element 208 that is set as a result of programming the on-chip programmable pull up impedance matching array, for example, to provide an on-chip impedance reference value as an internal load for the pull down impedance matching array 206. Accordingly, the configurable on-chip impedance element 208 is used as a pull up impedance to adjust the pull down impedance of the programmable pull down impedance matching array 206.

A pull down test enable signal 216 and a pull up test enable signal 220 may be used, for example, if it is desired to test the impedance compensation circuit 100 at any suitable time and to control power dissipation. However, these signals and corresponding control logic may not be used, if desired.

In operation, it is desirable to avoid switching of the impedance matching arrays during bus activity. Accordingly, the bus calm signal 210 indicates when the controller can perform the impedance compensation function. Also, where the controller 104 includes, for example, digital comparators to compare, for example, the pull up test signals 212 and the pull down test signal 214 to a predetermined threshold, such as a reference voltage, the output of digital comparator may oscillate. Accordingly, the disclosed controller knows it has reached a desired impedance calibration level by detecting such an oscillation.

The controller 104 may include, for example, a plurality of up/down counters and a plurality of comparators wherein the output of the comparators is coupled to a separate up/down counter. Each up/down counter is suitably incremented or decremented to provide the control signals 218 and 222.

Figure 3:
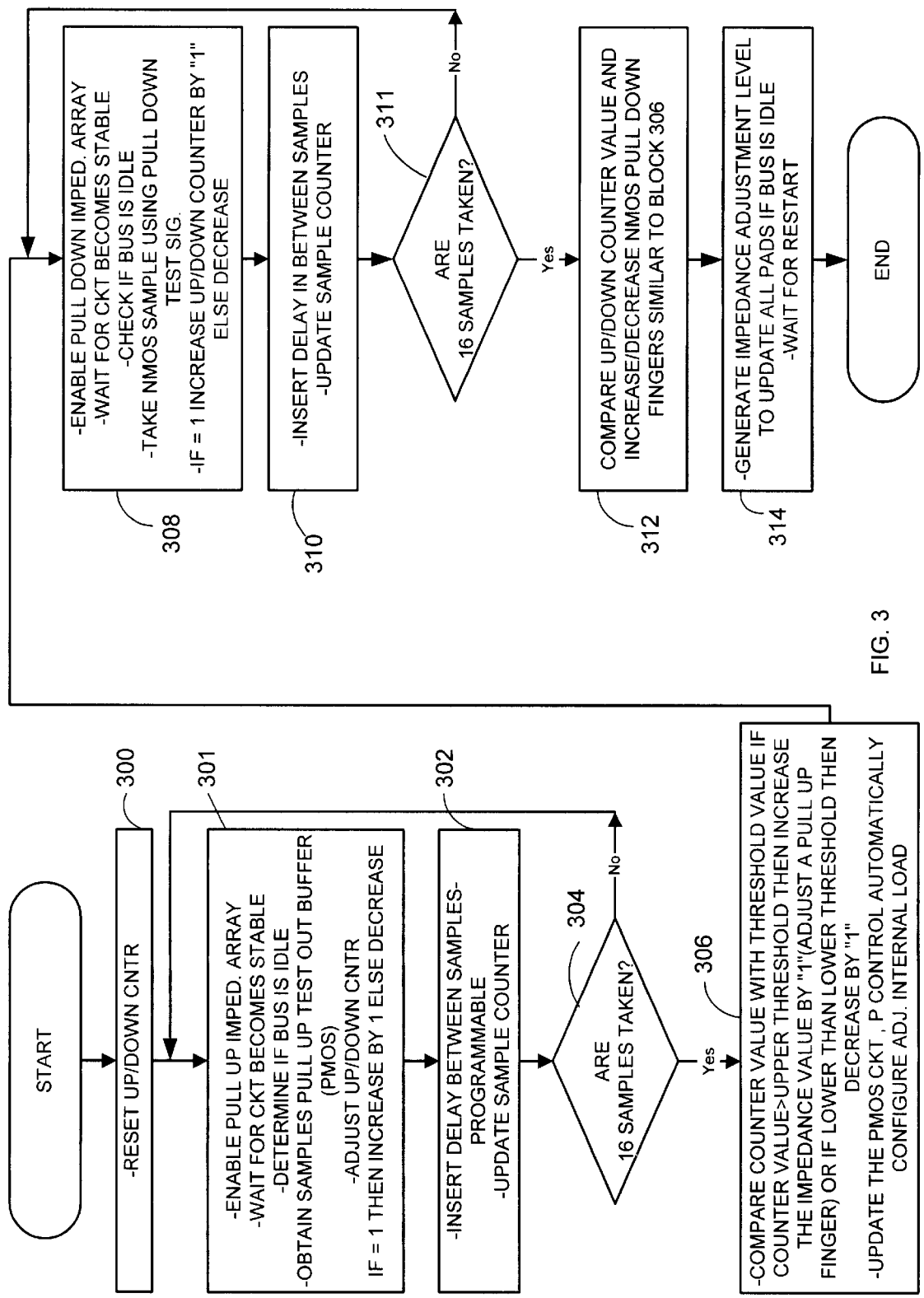
FIG. 3 is a flow chart illustrating one example of the operation of the controller circuit shown in FIG. 2.
Figure 4:
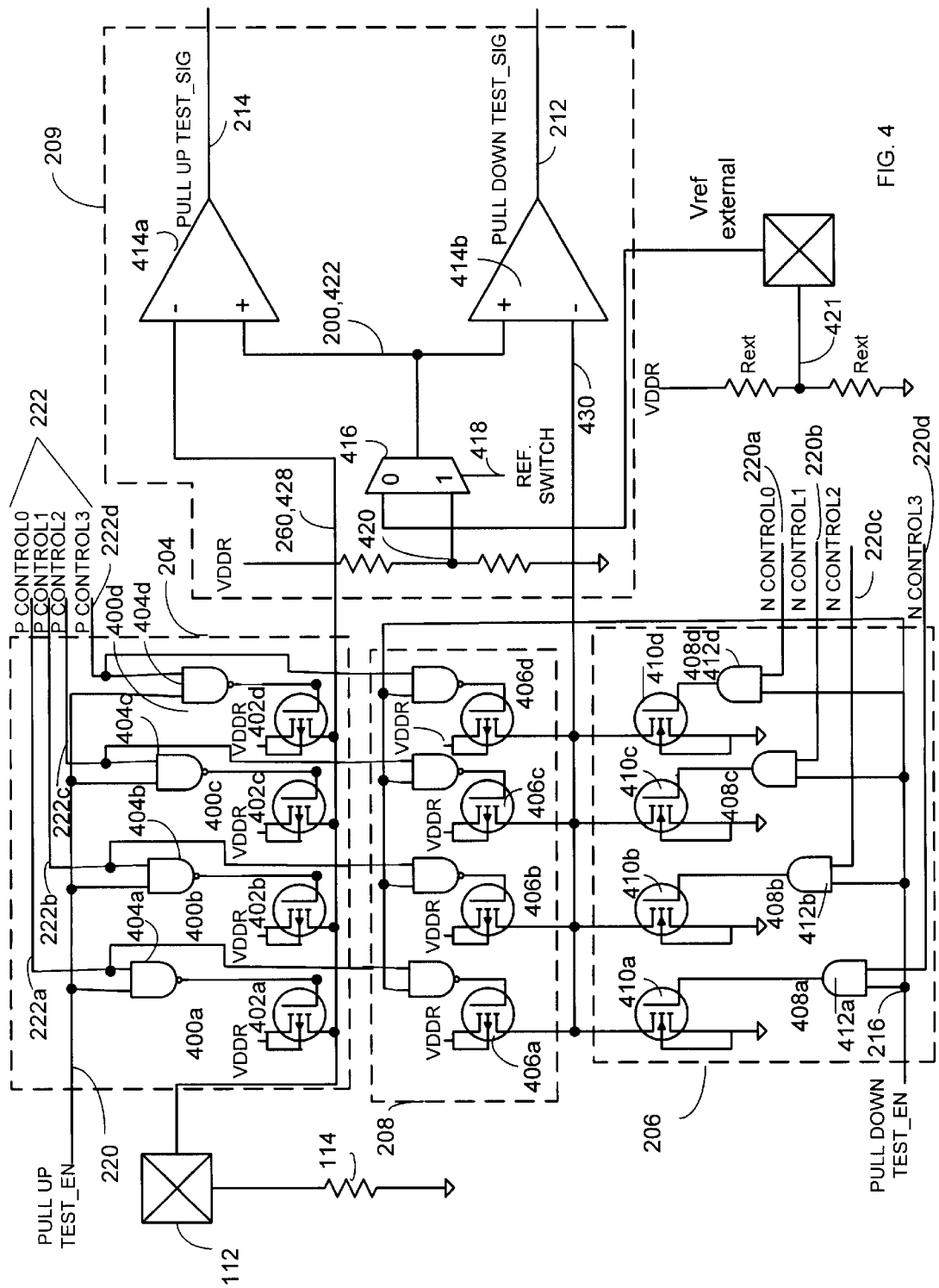
FIG. 4 is a circuit diagram illustrating on example of an impedance compensation circuit in accordance with one embodiment of the invention.

Referring to FIG. 3 and FIG. 4, an example of the operation of the controller 104 will now be explained. As shown in block 300, the method includes resetting an up/down counter. As shown in block 301, the method includes enabling the programmable pull up impedance matching array 204 through the pull up test enable signal. The controller 104 determines if the bus is idle by evaluating the bus calm signal 210. If the bus is idle, the controller measures the impedance of the on-chip programmable pull up impedance matching array 204 by sampling the pull up test signal 214 a plurality of times and storing the samples. The controller averages the samples and if a predetermined number of samples exceed a predetermined threshold, then the controller adjusts (in this example, increases) the impedance of the on-chip programmable pull up impedance matching array by an incremental amount. If the predetermined number of samples are below a predetermined threshold, then the controller adjusts (in this example, decreases) the impedance of the on-chip programmable pull up impedance matching array by turning on, for example, a plurality of PMOS transistor fingers 400a–400d that include a plurality of PMOS transistors 402a–402d operatively coupled in parallel. A plurality of NAND gates 404a–404d have an output operatively coupled to the gates of the plurality of PMOS transistors 402a–402d. Each of the NAND gates 404a–404d receive the pull up test enable signal 220. A separate control signal 222a–222d is provided to each of the plurality of PMOS transistors 402a–402d through NAND gates 404a–404d.

The configurable on-chip impedance element 208 includes a plurality of parallel coupled PMOS transistors 406a–406d. However, it will be recognized that any suitable type of device or configuration may also be used. In addition, if desired, the configurable on-chip impedance element 208 includes a plurality of NAND gates 407a–407d having an input operatively coupled to control signal 222, another input operatively coupled to pull down test enable signal 216 and an output operatively coupled to the gates of parallel coupled PMOS transistors 406a–406d.

The programmable pull down impedance matching array 206 includes a plurality of nmos transistor fingers 408a–408d. Each of the plurality of NMOS transistor fingers 408a–408d includes an NMOS transistor 410a–410d arrangement. In this embodiment, a plurality of AND gates 412a–412d are operatively coupled to receive control signals 220a–220d and also coupled to receive the pull down test enable signal 216. The configurable on-chip impedance element 208 serves as an adjustable pull up resistor for the on-chip programmable pull down impedance matching array 206. In this particular example, sources of each of the PMOS transistors 406a–406d are operatively coupled to sources of the plurality of NMOS transistors in the NMOS fingers in the on-chip programmable pull down impedance matching array 206. It will be recognized, that although not shown, each of the transistor fingers (e.g., 402a–400d, 406a–406d and 408a–408d) may be a plurality of serially coupled transistors that provide suitable overvoltage protection against over voltage conditions. Also, each of the fingers is preferable binary weighted as an impedance unit so that for example finger having transistor 402b has more fingers than the finger having transistor 402a, and transistor 402c has more fingers (lower impedance) than the finger having transistor 402b. However, it will be recognized that non-binary weighting may also be used if desired.

The configurable on-chip impedance element 208 receives the control signals 222a–222d to effectively duplicate the configuration of the PMOS transistors 402a–402d which are configured during the matching of the programmable impedance matching array to the external resistor 114.

As shown, a portion of the controller 104 includes comparators 414a and 414b. A multiplexer 416 allows a reference switch 418 to select whether an internal reference voltage 420 is used or whether an external reference voltage 421 is used as the comparator reference voltage 422. As shown, the impedance matching array 204 is selectively controlled so that the voltage drop across the array, namely voltage 428, equals the comparator reference voltage 422. Once the PMOS fingers 400a–400d have been suitably configured to provide the right amount of impedance, the controller then attempts to match the reference voltage 430 with the comparator reference voltage 422 to suitably set the pull down impedance matching array to a suitable impedance level. The controller controls the on-chip programmable pull up impedance matching array 204 to be initially set to provide an impedance setting for the configurable on-chip impedance element 208 whereafter the same impedance setting is used to configure the on-chip programmable pull down impedance matching array 206. For example, the on-chip programmable pull up impedance matching array 204 is configured to effectively match the impedance of the external resistor 114. The configurable on-chip impedance element 208 is set to the impedance value determined for the pull-up impedance matching array 204, then the programmable pull down impedance matching array 206 is set using the configurable on-chip impedance element 208 as its reference.

Referring back to FIG. 3, the controller suitably adjusts an up/down counter such that if the pull up test signal 214 is a "1", the up/down counter is increased by "1" impedance increment which may require more than one finger to be adjusted. However, if the pull up test signal is "0", the up/down counter is then decremented by a suitable amount . As shown in block 302, the controller inserts delays between samples to filter against noise transitions. In addition, the controller updates a sample counter for each sample taken. If 16 samples are taken, for example, as shown in block 304, the process continues by comparing the up/down counter value with a threshold value. If the up/down counter value is greater than an upper threshold, the control signal 222 is then increased by a value of "1" to adjust a single pull up finger, or a plurality of pull up fingers depending on the impedance level is required. If, however, the value of the up/down counter is below a predetermined threshold, the control signal is set to a logic zero on a particular finger or fingers to decrease the impedance. If the value is between the two thresholds, no adjustment is necessary. Hence, the controller updates the on-chip programmable pull up impedance matching array to automatically configure the adjustable internal load, namely, the configurable on-chip impedance element 208. This is shown, for example, in block 306. If desired, the controller can divide the samples into three areas, such as three levels of thresholds. For example, upon power up, a default impedance setting is used by using predefined impedance values to be more accurate at the start up of the output buffer. A different impedance threshold can be used at the beginning of the automatic adjustment operation. In addition, default settings for the impedance arrays may be hard coded both in the chip incorporating the circuits as well as in the BIOS associated with the chip.

Once the on-chip programmable pull up impedance matching array has been set to the suitable impedance level, the controller enables the NMOS-based on-chip programmable pull down impedance matching array and waits for a period of clocks to allow the array to stabilize. The controller then determines if the bus is idle and if so, takes samples using a pull down test signal. A separate up/down counter is used, for example, which is continually incremented or decremented based on the level of the pull down test signal such that if the signal is one, the count is increased by 1, whereas if it is zero, then it will decrease the counter. This is shown in block 308. As shown in block 310, again the controller inserts a delay in between samples to reduce the effect of noise and updates the sample counter. Similar to the operation with respect to the on-chip programmable pull up impedance matching array, the controller tracks the total number of samples and determines if it has received enough samples (e.g. 16) as indicated in block 311. As shown in block 312, the controller compares the output of the up/down counter after the 16 samples are taken and compares it to a threshold to determine whether to increase or decrease the impedance of the on-chip programmable pull down impedance matching array in a similar way as described with respect to block 306. This is continued until the on-chip programmable pull down impedance matching array is matched with the configurable on-chip impedance element. Once both the impedance matching arrays have been configured, the controller then generates the impedance adjustment levels to update all I/O pads when the bus is idle. This is shown in block 314.

FIG. 5 illustrates an alternative embodiment, wherein the external resistor is a pull up resistor 500. In this embodiment, again only a single external impedance resistor need be used, and only a single test pad need be used. In this embodiment, the on-chip programmable pull down impedance matching array is first configured to set the configurable on-chip impedance element whereafter the on-chip programmable pull up impedance matching array is configured using the settings of the impedance of the configurable on-chip impedance element. In addition, the AND gates are removed to provide direct control of the programmable pull up impedance matching arrays and the configurable on-chip impedance element. This applies to either a pull up or pull down embodiment. In this embodiment, the controller configures the on-chip impedance element 208 where it is initially set to provide an impedance setting for the on-chip programmable pull down impedance matching array 206 through control signals 220a 220d. Subsequently, the same impedance setting of the configurable on-chip impedance element is used to configure the on-chip programmable pull up impedance matching array 204. In this embodiment, the configurable on-chip impedance element 208 includes a plurality of parallel coupled NMOS transistors 408a–408d. The on-chip programmable pull down impedance matching array 206 includes NMOS transistors 410a–410d coupled to have sources connected to the external pad 112 and to an input of comparator 414a. The on-chip programmable pull up impedance matching array 204 includes PMOS transistors 406a–406d having sources operatively coupled to the sources of transistors 408a–408d.

Figure 6:
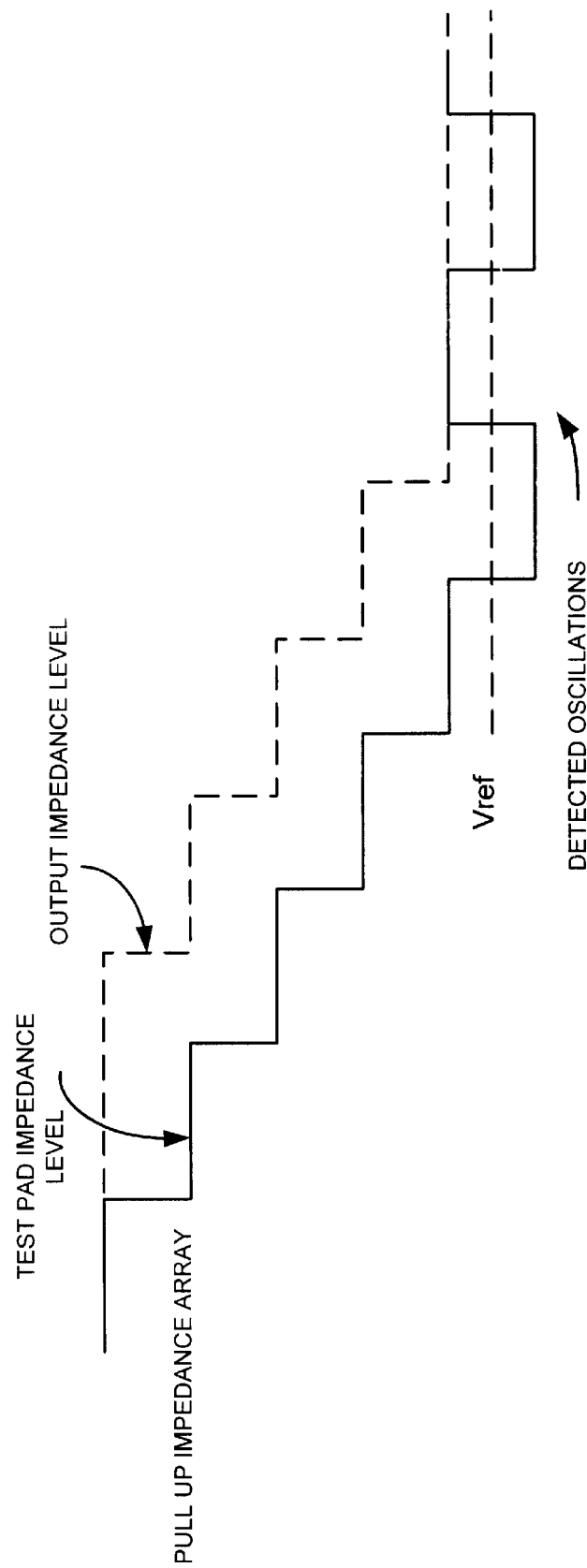
FIG. 6 diagramatically illustrates oscillation detection in accordance with one embodiment of the invention.

FIG. 6 illustrates the controller detecting a period of oscillations which indicates that an impedance match has occurred. Accordingly, adjustments to the impedance matching arrays of the I/O buffers are not made until a non-oscillation condition is detected. Hence, the circuit 100 maintains an impedance adjustment level for the pull up or pull down circuit of the buffer while detecting a test pad oscillation. Preferably, although not required, the output pad impedance can be set to a lowest value to provide a robust output buffer when the differential comparator is oscillating between two impedance levels.

It should be understood that the implementation of other variations and modifications of the invention in its various aspects will be apparent to those of ordinary skill in the art, and that the invention is not limited by the specific embodiments described. For example, any suitable type of impedance fingers may be used including but not limited to bipolar based impedance fingers, switched capacitor impedance fingers or any other suitable configurable impedance providing arrangement. In addition, the disclosed logic may be inverted (e.g., AND logic can be NAND logic, NOR logic or any suitable logic states) or otherwise implemented using any suitable logic or software. In addition, the measurement of a voltage drop across the configurable impedance element includes the measurement of current through the configurable impedance element. It is therefore contemplated to cover by the present invention, any and all modifications, variations, or equivalents that fall within the spirit and scope of the basic underlying principles disclosed and claimed herein.

What is claimed is:

1. A method of impedance compensation for an input/out buffer having an output driver pull up circuit and an output driver pull down circuit, comprising the steps of:
   determining a first impedance adjustment level for the output driver pull up circuit based on an external impedance element using an on-chip programmable pull up impedance matching array;
   adjusting a configurable on-chip impedance element to a current impedance setting based on the determined first impedance adjustment level; and
   subsequently determining a second impedance adjustment level for the output driver pull down circuit, based from the current impedance setting of the configurable, internal impedance element, using an on-chip programmable pull down impedance matching array.

2. The method of claim 1 wherein the step of determining the first impedance adjustment level includes comparing a voltage drop across the external impedance element with a voltage drop across the on-chip programmable pull up impedance matching array and programming the on-chip programmable pull up impedance matching array in response to the comparison of the voltage drops.

3. The method of claim 2 wherein programming the on-chip programmable pull up impedance matching array includes selecting at least one of a plurality of impedance fingers in a plurality of parallel coupled impedance fingers.

4. The method of claim 3 wherein each of the plurality of impedance fingers includes at least one pmos transistor.

5. The method of claim 1 wherein the step of subsequently determining the second impedance adjustment level for the output driver pull down circuit, based from the current impedance setting of the configurable on-chip impedance element includes comparing a voltage drop across the configurable on-chip impedance element at the current impedance setting to a reference voltage and programming the on-chip programmable pull down impedance matching array in response to the comparison of the voltage drops.

6. The method of claim 1 including the step of using a single off chip pad for both determining the first impedance adjustment level and the second impedance adjustment level.

7. The method of claim 1 wherein the steps of determining the first impedance adjustment level for the output driver pull up circuit and subsequently determining a second impedance adjustment level for the output driver pull down circuit includes the step of using the configurable on-chip impedance element as a pull up impedance setting to adjust a pull down impedance setting.

8. The method of claim 3 wherein programming the on-chip programmable pull up impedance matching array includes selecting at least one of a plurality of different impedance fingers in a plurality of parallel coupled impedance fingers by one impedance unit at a time to prevent impedance adjustment oscillations.

9. The method of claim 5 wherein programming the on-chip programmable pull down impedance matching array includes selecting at least one of a plurality of impedance fingers in a plurality of parallel coupled impedance fingers.

10. The method of claim 1 including the steps of:
   measuring an impedance of the on-chip programmable pull up impedance matching array by sampling a pull up test signal a plurality of times;
   storing the samples;
   averaging the samples and if the average exceeds a first predetermined threshold, then adjusting the impedance of the on-chip programmable pull up impedance matching array, otherwise
   if the average is below a second predetermined threshold, then adjusting the impedance of the on-chip programmable pull up impedance matching array.

11. The method of claim 10 wherein the step of sampling the pull up test signal is performed in response to detecting that an I/O buffer bus is idle.

12. The method of claim 2 including the step of determining that the on-chip programmable pull up impedance matching array is at a desired impedance in response to detecting an oscillation based on the comparison.

13. The method of claim 1 including the step of maintaining an impedance adjustment level while detecting a test pad oscillation.

14. A method of impedance compensation for an input/output buffer having an output driver pull up circuit and an output driver pull down circuit, comprising the steps of:
   determining a first impedance adjustment level for the output driver pull down circuit based on an external impedance element using an on-chip programmable pull down impedance matching array;
   adjusting a configurable on-chip impedance element to a current impedance setting based on the determined first impedance adjustment level; and
   subsequently determining a second impedance adjustment level for the output driver pull up circuit, based from the current impedance setting of the configurable internal impedance element, using an on-chip programmable pull up impedance matching array.

15. The method of claim 14 wherein the step of determining the first impedance adjustment level includes comparing a voltage drops across the external impedance element with a voltage drop across the on-chip programmable pull down impedance matching array and programming the on-chip programmable pull down impedance matching array in response to the comparison of the voltage drops.

16. The method of claim 15 wherein programming the on-chip programmable pull down impedance matching array includes selecting at least one of a plurality of impedance fingers in a plurality of parallel coupled impedance fingers.

17. The method of claim 16 wherein each of the plurality of impedance fingers includes at least one NMOS transistor.

18. The method of claim 14 wherein the step of subsequently determining the second impedance adjustment level for the output driver pull up circuit, based from the current impedance setting of the configurable internal impedance element includes comparing a voltage drop across the configurable on-chip impedance element at the current impedance setting to a reference voltage and programming the on-chip programmable pull up impedance matching array in response to the comparison of the voltage drops.

19. The method of claim 14 including the step of using a single off chip pad for both determining the first impedance adjustment level and the second impedance adjustment level.

20. The method of claim 14 wherein the steps of determining the first impedance adjustment level for the output driver pull down circuit and subsequently determining a second impedance adjustment level for the output driver pull up circuit include the step of using the configurable on-chip impedance element as a pull down impedance setting to adjust a pull up impedance setting.

21. The method of claim 15 wherein programming the on-chip programmable pull down impedance matching array includes selecting at least one of a plurality of different impedance fingers in a plurality of parallel coupled impedance fingers by one impedance unit at a time to prevent impedance adjustment oscillations.

22. The method of claim 18 wherein programming the on-chip programmable pull up impedance matching array includes selecting at least one of a plurality of impedance fingers in a plurality of parallel coupled impedance fingers.

23. The method of claim 15 including the step of determining that the on-chip programmable pull up impedance matching array is at a desired impedance in response to detecting an oscillation based on the comparison.

24. An impedance compensation method for an input/output buffer having an output driver pull up circuit and an output driver pull down circuit, comprising the steps of:

controlling at least one of an on-chip programmable pull up impedance matching array and an on-chip programmable pull down impedance matching array to an impedance to match a predetermined off chip impedance; and using an impedance of a configurable on-chip impedance element that is set as a result of programming the on-chip programmable pull up impedance matching array, to provide an on-chip impedance reference value.

25. The impedance compensation method of claim 24 including the step of using the configurable on-chip impedance element as a pull down impedance setting to adjust a pull up impedance setting.

26. The impedance compensation method of claim 24 including the step of using the configurable on-chip impedance element as a pull up impedance to adjust a pull down impedance.

27. The method of claim 24 including the step of determining that the on-chip programmable pull up impedance matching array is at a desired impedance in response to detecting an oscillation based on a comparison of a voltage level with a reference voltage level.

28. The method of claim 24 including the step of determining that the on-chip programmable pull down impedance matching array is at a desired impedance in response to detecting an oscillation based on a comparison of a voltage level with a reference voltage.

29. An impedance compensation circuit for an input/output buffer having an output driver pull up circuit and an output driver pull down circuit, comprising:

an on-chip programmable pull up impedance matching array;

an on-chip programmable pull down impedance matching array; and a configurable on-chip impedance element operatively coupled to provide impedance settings for both the on-chip programmable pull up impedance matching array and the on-chip programmable pull down impedance matching array.

30. The impedance compensation circuit of claim 29 including a controller operatively coupled to the on-chip programmable pull up impedance matching array, the on-chip programmable pull down impedance matching array and to the configurable on-chip impedance element wherein the on-chip programmable pull up impedance matching array is initially set to provide an impedance setting for the configurable on-chip impedance element, whereafter the same impedance setting is used to configure the on-chip programmable pull down impedance matching array.

31. The impedance compensation circuit of claim 29 including a controller operatively coupled to the on-chip programmable pull up impedance matching array, the on-chip programmable pull down impedance matching array and to the configurable on-chip impedance element wherein the on-chip programmable pull down impedance matching array is initially set to provide an impedance setting for the configurable on-chip impedance element, whereafter the same impedance setting is used to configure the on-chip programmable pull up impedance matching array.

32. The impedance compensation circuit of claim 29 wherein the on-chip programmable pull up impedance matching array is operatively coupled to an on chip test pad.

33. The impedance compensation circuit of claim 29 wherein the on-chip programmable pull up impedance matching array includes a plurality of PMOS transistor fingers.

34. The impedance compensation circuit of claim 33 wherein the on-chip programmable pull down impedance matching array includes a plurality of NMOS transistor fingers.

35. The impedance compensation circuit of claim 34 wherein the configurable on-chip impedance element includes a plurality of parallel coupled PMOS transistors having gates operatively coupled to outputs of NAND gates associated with the on-chip programmable pull up impedance matching array, and sources operatively coupled to sources of the plurality of pmos transistor fingers in the on-chip programmable pull up impedance matching array.

36. An impedance compensation circuit for an input/output buffer having an output driver pull up circuit and an output driver pull down circuit, comprising:

an on-chip programmable pull up impedance matching array having a first plurality of parallel coupled impedance fingers controllable to attain a first impedance level for the output driver pull up circuit, based on an off-chip impedance element;

a configurable on-chip impedance element operatively coupled to the on-chip programmable pull up impedance matching array and operably controllable to a current impedance setting based on the first impedance level; and an on-chip programmable pull down impedance matching array operatively coupled to the configurable on-chip impedance element, having a second plurality of parallel coupled impedance fingers wherein a second impedance adjustment level for the output driver pull down circuit is based on the current impedance setting associated with the on-chip programmable pull up impedance matching array.

37. The impedance compensation circuit of claim 36 wherein the on-chip programmable pull up impedance matching array is operatively coupled to an on chip test pad.

38. The impedance compensation circuit of claim 36 including a controller operatively coupled to the on-chip programmable pull up impedance matching array, the on-chip programmable pull down impedance matching array and to the configurable on-chip impedance element wherein the on-chip programmable pull up impedance matching array is initially set to provide an impedance setting for the configurable on-chip impedance element, whereafter the adjusted on-chip impedance element setting is used to configure the on-chip programmable pull down impedance matching array.

39. The impedance compensation circuit of claim 38 wherein the controller includes a first comparator operatively coupled to determine the first impedance adjustment level by comparing a voltage drops across the external impedance element with a voltage drop across the on-chip programmable pull up impedance matching array and wherein the controller programs the on-chip programmable pull up impedance matching array in response to the comparison of the voltage drops.

40. The impedance compensation circuit of claim 36 wherein the on-chip programmable pull up impedance matching array includes a plurality of parallel coupled impedance fingers and the controller programs the on-chip programmable pull up impedance matching array by selecting at least one of the plurality of impedance fingers.

41. The impedance compensation circuit of claim 40 wherein each of the plurality of impedance fingers includes at least one pmos transistor.

42. The impedance compensation circuit of claim 39 including a second comparator that compares a voltage drop across the configurable on-chip impedance element at the current impedance setting to a reference voltage and programming the on-chip programmable pull down impedance matching array in response to the comparison of the voltage drops.

43. The impedance compensation circuit of claim 36 wherein only the on-chip programmable pull up impedance matching array is operatively coupled to a single off chip pad.

44. The impedance compensation circuit of claim 36 including a controller operatively coupled to provide programming of the on-chip programmable pull up impedance matching array by selecting at least one of a plurality of different impedance fingers in a plurality of parallel coupled impedance fingers by one finger unit at a time to prevent impedance adjustment oscillations.

45. The impedance compensation circuit of claim 36 including a controller operatively coupled to:

measure an impedance of the on-chip programmable pull up impedance matching array by sampling a pull up test signal a plurality of times;

storing the samples;

averaging the samples and if a predetermined number exceed a programmable first threshold, then increasing the impedance of the on-chip programmable pull up impedance matching array, otherwise if a predetermined number of samples are below a programmable second threshold, then decreasing the impedance of the on-chip programmable pull up impedance matching array.

46. The impedance compensation circuit of claim 45 wherein the controller samples the pull up test signal is performed in response to detecting that an I/O buffer bus is idle.

47. The impedance compensation circuit of claim 45 wherein the controller determines that the on-chip programmable pull up impedance matching array is at a desired impedance in response to detecting an oscillation based on the comparison.

* * * * *